United States Patent
Young et al.

(10) Patent No.: US 9,925,755 B2
(45) Date of Patent: *Mar. 27, 2018

(54) CLAMPING APPARATUS FOR CLEAVING A BONDED WAFER STRUCTURE AND METHODS FOR CLEAVING

(71) Applicant: SunEdison Semiconductor Limited (UEN201334164H), Singapore (SG)

(72) Inventors: Gregory A. Young, O'Fallon, MO (US); Jeffrey L. Libbert, O'Fallon, MO (US)

(73) Assignee: SunEdison Semiconductor Limited (UEN201334164H), Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/845,327

(22) Filed: Sep. 4, 2015

(65) Prior Publication Data

US 2015/0375495 A1 Dec. 31, 2015

Related U.S. Application Data

(63) Continuation of application No. 13/663,038, filed on Oct. 29, 2012, now Pat. No. 9,165,802, which is a (Continued)

(51) Int. Cl.
*B32B 38/10* (2006.01)
*H01L 21/67* (2006.01)
*B32B 43/00* (2006.01)

(52) U.S. Cl.
CPC ............ *B32B 43/006* (2013.01); *B32B 38/10* (2013.01); *H01L 21/67092* (2013.01);
(Continued)

(58) Field of Classification Search
CPC  B32B 43/006; C09J 2205/302; Y10S 156/93; Y10S 156/941; Y10T 156/1168; Y10T 156/1184; Y10T 156/1961; Y10T 156/1978; H01L 2221/68386; H01L 2221/6839

See application file for complete search history.

(56) References Cited

U.S. PATENT DOCUMENTS

| | | | |
|---|---|---|---|
| 3,866,883 A | 2/1975 | Goransson | |
| 5,367,762 A | 11/1994 | Disko et al. | |

(Continued)

FOREIGN PATENT DOCUMENTS

| | | |
|---|---|---|
| EP | 1178521 A2 | 2/2002 |
| JP | 2008277552 A | 11/2008 |

(Continued)

OTHER PUBLICATIONS

International Search Report and Written Opinion for Application No. PCT/US2012/062194, dated Jan. 30, 2013, pp. 13.

(Continued)

*Primary Examiner* — Mark A Osele
(74) *Attorney, Agent, or Firm* — Armstrong Teasdale LLP

(57) ABSTRACT

Apparatus and methods for mechanically cleaving a bonded wafer structure are disclosed. The apparatus and methods involve clamps that grip the bonded wafer structure and are actuated to cause the bonded structure to cleave.

19 Claims, 13 Drawing Sheets

Related U.S. Application Data continuation of application No. 13/663,073, filed on Oct. 29, 2012, now Pat. No. 9,159,596.

(60) Provisional application No. 61/553,447, filed on Oct. 31, 2011.

(52) U.S. Cl.
CPC . *C09J 2205/302* (2013.01); *H01L 2221/6839* (2013.01); *H01L 2221/68386* (2013.01); *Y10S 156/93* (2013.01); *Y10S 156/941* (2013.01); *Y10T 156/1168* (2015.01); *Y10T 156/1184* (2015.01); *Y10T 156/1961* (2015.01); *Y10T 156/1978* (2015.01); *Y10T 225/10* (2015.04); *Y10T 225/12* (2015.04); *Y10T 225/357* (2015.04); *Y10T 225/393* (2015.04)

(56) References Cited

U.S. PATENT DOCUMENTS

| | | |
|---|---|---|
| 5,772,842 A | 6/1998 | Tanaka et al. |
| 5,897,743 A | 4/1999 | Fujimoto et al. |
| 6,221,740 B1 | 4/2001 | Bryan et al. |
| 6,263,941 B1 | 7/2001 | Bryan et al. |
| 6,336,787 B1 | 1/2002 | Chang et al. |
| 6,391,740 B1 | 5/2002 | Cheung et al. |
| 6,427,747 B1 | 8/2002 | Omi et al. |
| 6,444,082 B1 | 9/2002 | Campbell et al. |
| 6,491,083 B2 | 12/2002 | De et al. |
| 6,513,564 B2 | 2/2003 | Bryan et al. |
| 6,653,205 B2 | 11/2003 | Yanagita et al. |
| 6,672,358 B2 | 1/2004 | Yanagita et al. |
| 6,792,991 B2 | 9/2004 | Thallner |
| 7,052,934 B2 | 5/2006 | Kurimoto et al. |
| 7,150,804 B2 | 12/2006 | Tajima |
| 7,510,948 B2 | 3/2009 | Morimoto et al. |
| 8,245,754 B2 | 8/2012 | Fujita et al. |
| 8,701,734 B2 | 4/2014 | Nakamura |
| 8,845,859 B2 | 9/2014 | Ries et al. |
| 9,159,596 B2 * | 10/2015 | Young .............. H01L 21/67092 |
| 9,165,802 B2 | 10/2015 | Young et al. |
| 2002/0000649 A1 | 1/2002 | Tilmans et al. |
| 2002/0023725 A1 | 2/2002 | Bryan et al. |
| 2005/0000649 A1 * | 1/2005 | Rayssac .............. B28D 5/0011 |
| | | 156/717 |
| 2005/0173064 A1 | 8/2005 | Miyanari |
| 2006/0166472 A1 | 7/2006 | Henley et al. |
| 2007/0119893 A1 | 5/2007 | Rayssac et al. |
| 2007/0122926 A1 | 5/2007 | Martinez et al. |
| 2009/0166930 A1 | 7/2009 | Fujita et al. |
| 2009/0314430 A1 | 12/2009 | Nakamura |
| 2015/0096689 A1 | 4/2015 | Wimplinger et al. |

FOREIGN PATENT DOCUMENTS

| | | |
|---|---|---|
| JP | 2011146457 A | 7/2011 |
| TW | 200419690 A | 10/2004 |

OTHER PUBLICATIONS

Non-Final Office Action, U.S. Appl. No. 13/663,073, dated Dec. 10, 2014, pp. 13.
Non-Final Office Action, U.S. Appl. No. 13/663,038, dated Oct. 9, 2014, pp. 9.
Advisory Action, U.S. Appl. No. 13/663,073, dated Jul. 9, 2015, pp. 3.
Advisory Action, U.S. Appl. No. 13/663,038, dated Jul. 13, 2015, pp. 3.
Final Office Action, U.S. Appl. No. 13/663,038, dated May 29, 2015, pp. 7.
Non-Final Office Action, U.S. Appl. No. 13/663,038, dated Feb. 2, 2015, pp. 8.
Non-Final Office Action, U.S. Appl. No. 13/663,073, dated Feb. 2, 2015, pp. 6.
Final Office Action, U.S. Appl. No. 13/663,073, dated May 29, 2015, pp. 7.

\* cited by examiner

CLAMPING APPARATUS FOR CLEAVING A BONDED WAFER STRUCTURE AND METHODS FOR CLEAVING

CROSS-REFERENCES TO RELATED APPLICATIONS

The present application is a Continuation of U.S. patent application Ser. No. 13/663,038, filed Oct. 29, 2012 and of U.S. patent application Ser. No. 13/663,073, filed Oct. 29, 2012, which both claim the benefit of U.S. Provisional Application No. 61/553,447 filed Oct. 31, 2011, each of which is incorporated herein by reference in its entirety.

FIELD OF THE DISCLOSURE

This disclosure generally relates to apparatus and methods for cleaving a bonded wafer structure and, more particularly, to apparatus and methods that involve clamps that are actuated to cause the bonded structure to cleave.

BACKGROUND

Semiconductor wafers are generally prepared from a single crystal ingot (e.g., a silicon ingot) which is sliced into wafers. The wafers are ground and/or polished to produce product wafers. While reference will be made herein to semiconductor wafers constructed from silicon, other materials may be used as well, such as germanium or gallium arsenide.

One type of wafer is a silicon-on-insulator (SOI) wafer. An SOI wafer includes a thin layer of silicon atop an insulating layer (e.g., an oxide layer), which is in turn disposed on a silicon substrate.

An exemplary process of making an SOI wafer includes depositing a layer of oxide on a polished front surface of a donor wafer and/or a handle wafer. Particles (e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds deposited on the wafer during the implantation process.

The front surface of the donor wafer is then bonded to a handle wafer to form a bonded wafer pair through a hydrophilic bonding process. The donor wafer and handle wafer are bonded together by exposing the surfaces of the wafers to plasma containing, for example, oxygen or nitrogen. Exposure to the plasma modifies the structure of the surfaces in a process often referred to as surface activation. The wafers are then pressed together and a bond is formed therebetween. This bond is relatively weak, and must be strengthened before further processing can occur.

In some processes, the hydrophilic bond between the donor wafer and handle wafer (i.e., a bonded wafer) is strengthened by heating or annealing the bonded wafer pair at temperatures between approximately 300° C. and 500° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane. A portion of the donor wafer is then separated (i.e., cleaved) along the cleave plane from the bonded wafer pair to form the SOI wafer.

The bonded wafer is first placed in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the interface between the donor wafer and the handle wafer. The application of the mechanical force initiates propagation of a cleave along the cleave plane. The mechanical force applied by the suction cups then pulls a portion of the donor wafer away from the bonded wafer, thus forming an SOI wafer.

The resulting SOI wafer thus comprises a thin layer of silicon disposed atop the oxide layer and the handle wafer. The thickness of the layer may be non-uniform. The layer may also have a non-uniform roughness. This non-uniform thickness and roughness of the layer may be the result of the cleave propagating at varying speeds and/or the mechanical force applied by the suction cups. Additional processing is thus required to reduce the variation in thickness of the layer and/or smooth this layer. These additional processing steps are both time consuming and costly.

Thus, there remains a continuing need for a system and method for cleaving a bonded wafer structure that results in the structure having a layer with a relatively uniform thickness and roughness.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to an apparatus for cleaving a bonded wafer structure that includes a first wafer and a second wafer. The first wafer has a peripheral edge that includes a first portion and the second wafer has a peripheral edge that includes a second portion. The first portion is disposed opposite the second portion. The apparatus has a first arm, a first clamp, a second arm and a second clamp. The first clamp is mounted on the first arm and has a surface for contacting the first portion of the peripheral edge of the first wafer. The second clamp is mounted on the second arm and has a surface for contacting the second portion of the peripheral edge of the second wafer.

Another aspect of the present disclosure is directed to a method of cleaving a bonded wafer structure that includes a first wafer and a second wafer. The first wafer has a peripheral edge that includes a first portion and the second wafer has a peripheral edge that includes a second portion. The first portion is disposed opposite the second portion. The first portion of the peripheral edge of the first wafer is contacted with a surface of a first clamp mounted on a first arm. The second portion of the peripheral edge of the second wafer is contacted with a surface of a second clamp mounted on a second arm. The bonded wafer structure is cleaved by at least one of (1) applying an upward force on the first wafer by actuating the first clamp upward or (2) applying a downward force on the second wafer by actuating the second clamp downward.

A further aspect of the present disclosure is directed to an apparatus for cleaving a bonded wafer structure that includes a first wafer and a second wafer. The first wafer has a peripheral edge that includes a first portion and the second wafer has a peripheral edge that includes a second portion. The first portion is disposed opposite the second portion. The apparatus includes a first grasping member and a second grasping member. The first grasping member has one or more annular members. The annular members have a surface for contacting the first portion of the peripheral edge of the first wafer. The second grasping member has one or more annular members. The annular members have a surface for contacting the second portion of the peripheral edge of the second wafer.

Yet another aspect of the present disclosure is directed to a method of cleaving a bonded wafer structure that includes a first wafer and a second wafer. The first wafer has a peripheral edge that includes a first portion and the second wafer has a peripheral edge that includes a second portion. The first portion is disposed opposite the second portion. The first portion of the peripheral edge of the first wafer is contacted with a surface of an annular member of a first grasping member. The second portion of the peripheral edge of the second wafer is contacted with a surface of an annular member of a second grasping member. The bonded wafer structure is cleaved by at least one of (1) applying an upward force on the first wafer by actuating the first grasping member upward or (2) applying a downward force on the second wafer by actuating the second grasping member downward.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

The embodiments described herein generally relate to apparatus and methods for mechanically cleaving a bonded wafer structure such as a bonded wafer pair. The apparatus and methods cleave (i.e., separate) the bonded structure along a cleave plane within the structure to form a new structure such as a silicon-on-insulator (SOI) wafer. While reference is made herein to use of the apparatus and methods to form silicon-on-insulator structures, the systems and methods can also be used to form other structures without limitation.

Figure 3:
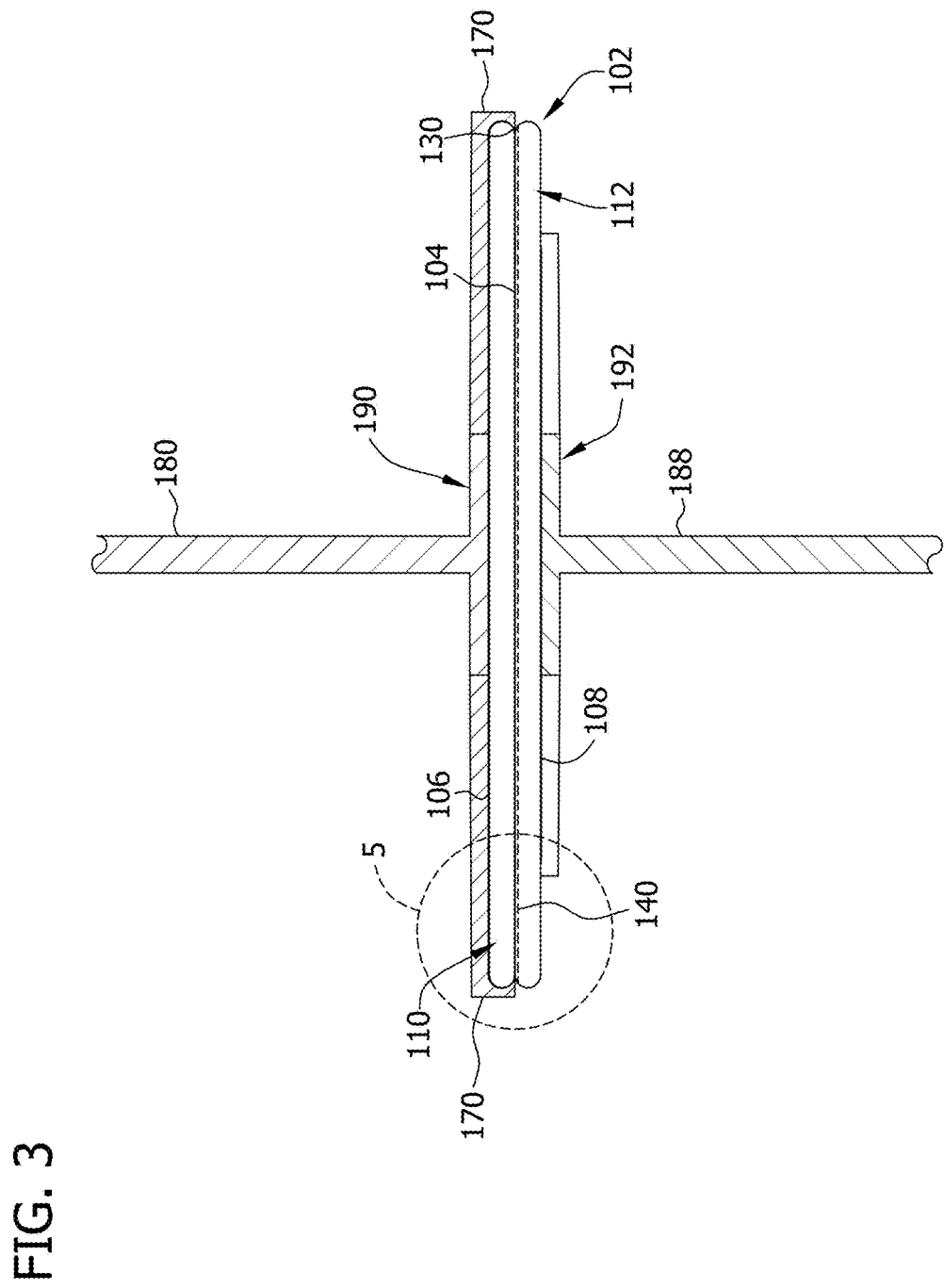
FIG. 3 is a cross-sectional view of FIG. 1 taken along the 3-3 line showing the apparatus prior to cleaving the bonded wafer structure.
Figure 4:
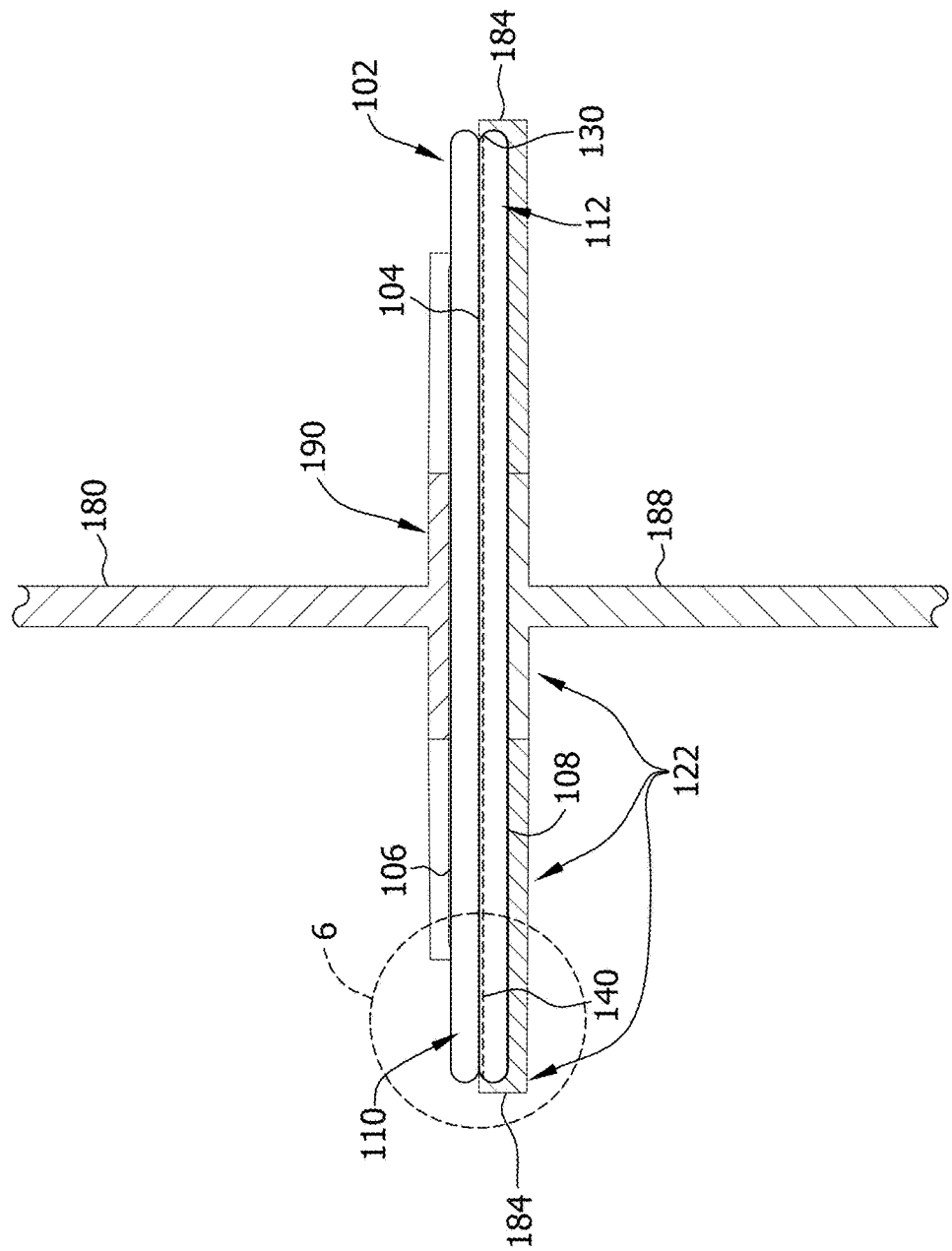
FIG. 4 is a cross-sectional view of FIG. 1 taken along the 4-4 line showing the apparatus prior to cleaving the bonded wafer structure.

FIGS. 1-7 depict an apparatus 100 for mechanically cleaving a bonded structure 102. The bonded structure 102 shown in FIGS. 1-7 is a bonded wafer pair. However, it should be noted that structures other than a bonded wafer pair may be cleaved by use of the apparatus 100. Referring to FIGS. 3 and 4, the structure 102 is separated along a cleave plane 140 shown in phantom. The bonded structure 102 has an upper surface 106 (generally, a first surface) and an opposing lower surface 108 (generally, a second surface). The bonded structure contains a handle wafer 110 (generally, a first wafer) bonded to a donor wafer 112 (generally, a second wafer) along a bond interface 104. The distance between the cleave plane 140 in the donor wafer 112 and the bond interface 104 is exaggerated for the sake of clarity. Furthermore, in other embodiments, the position of the handle wafer 110 and the donor wafer 112 may be reversed such that the handle wafer is disposed beneath the donor wafer.

Figure 5:
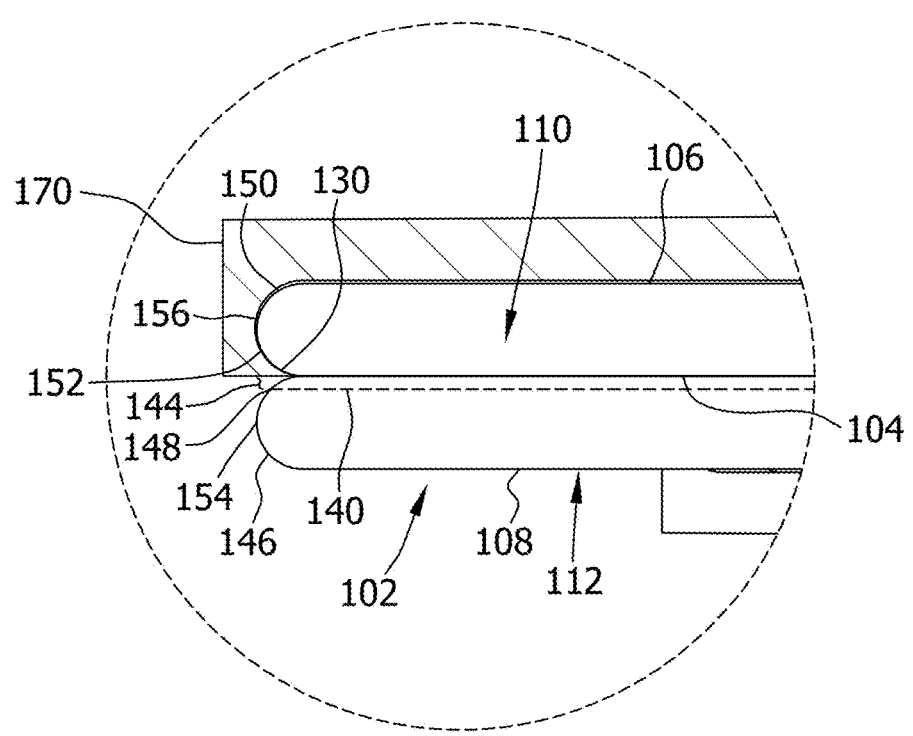
FIG. 5 is an enlarged portion of FIG. 3.
Figure 6:
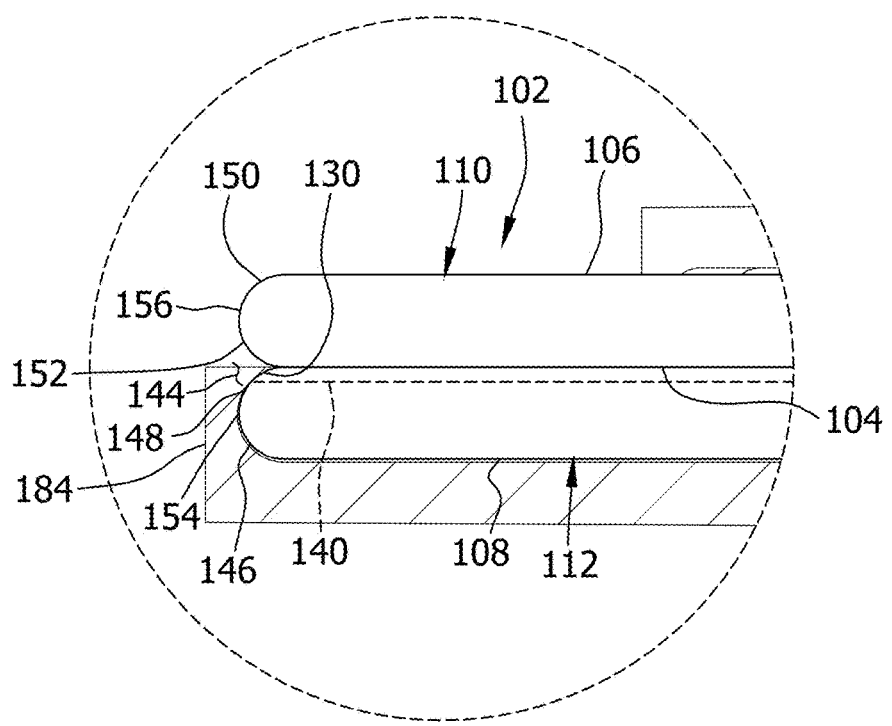
FIG. 6 is an enlarged portion of FIG. 4.

As shown in FIGS. 5 and 6, the donor wafer 112 and handle wafer 110 are beveled at their peripheral edge. It should be noted that the peripheral edge of the wafers may have a variety of geometries (e.g., rounded, bulleted). As used herein, the term "beveled" refers to a geometry in which the edge is not substantially perpendicular to the front and back surface of the wafer and has one or more tapered edges and should not be considered in a limiting sense. Further, it should be noted that, as used herein a "tapered edge" refers merely to a surface at the wafer edge that is not parallel to the front and back surfaces but rather slopes upward or downward toward the portion of the edge that is most distant from the center of the wafer. Further, such "tapered edges" may be straight or arcuate or may contain both straight and arcuate portions.

As also shown in FIGS. 5 and 6, the donor wafer 112 and handle wafer 110 have rounded edges. The edge of the donor wafer 112 has a first portion 148 and the edge of the handle wafer 110 has a second portion 152, the first portion being disposed opposite the second portion thereby forming a depression 144 between the two edges. Generally the first portion 148 and second portion 152 are tapered edges of the wafer, the edges taping upward or downward depending on the orientation of the bonded wafer pair. As shown in FIGS. 5 and 6, the donor wafer 112 has a tapered edge 146 (synonymously "upwardly tapered edge") that slopes upward from the lower surface 108 of the bonded structure toward the portion (or "point" as with rounded edges) 154 of the edge that is most distant from the center of the wafer. The donor wafer 112 also includes an edge 148 (synonymously "downwardly tapered edge" or "first portion" as described above) that slopes downward from the interface 104 toward the most outward portion 154 of the edge. Similar to the donor wafer 112, the handle wafer 110 includes an upwardly tapered edge 152 (or "second portion" as described above) that slopes toward the most outward portion 156 of the edge of the handle wafer and a downwardly tapered edge 150 that tapers to the most outward portion 156 of the edge of the handle wafer 110. The downward sloping edge 148 of the donor wafer 112 and the upward sloping edge 152 of the handle wafer 110 form a depression 144 between the two edges.

As shown in FIGS. 1-4, the apparatus 100 includes a plurality of first clamps 170 (or "upper clamps") that releasably secure the handle wafer 110 and a plurality of second clamps 184 that releasably secure the donor wafer 112. The clamps 170, 184 are mounted respectively to first arms 160 and second arms 166. The first arms 160 extend from a first central disk 190 and the second arms 166 extend from a second central disk 192. The first central disk 190 may contact the upper surface 106 of the bonded structure 102 to properly align the first clamps 170 in relation to the structure 102. Similarly, the second central disk 192 may assist in aligning the second clamps 184. The first clamps 170, first arms 160 and first central disk 190 together form a first grasping member 120 (FIG. 1) and the second clamps 184, second arms 184 and second central disk 192 together form a second grasping member 122 (FIG. 4).

Figure 1:
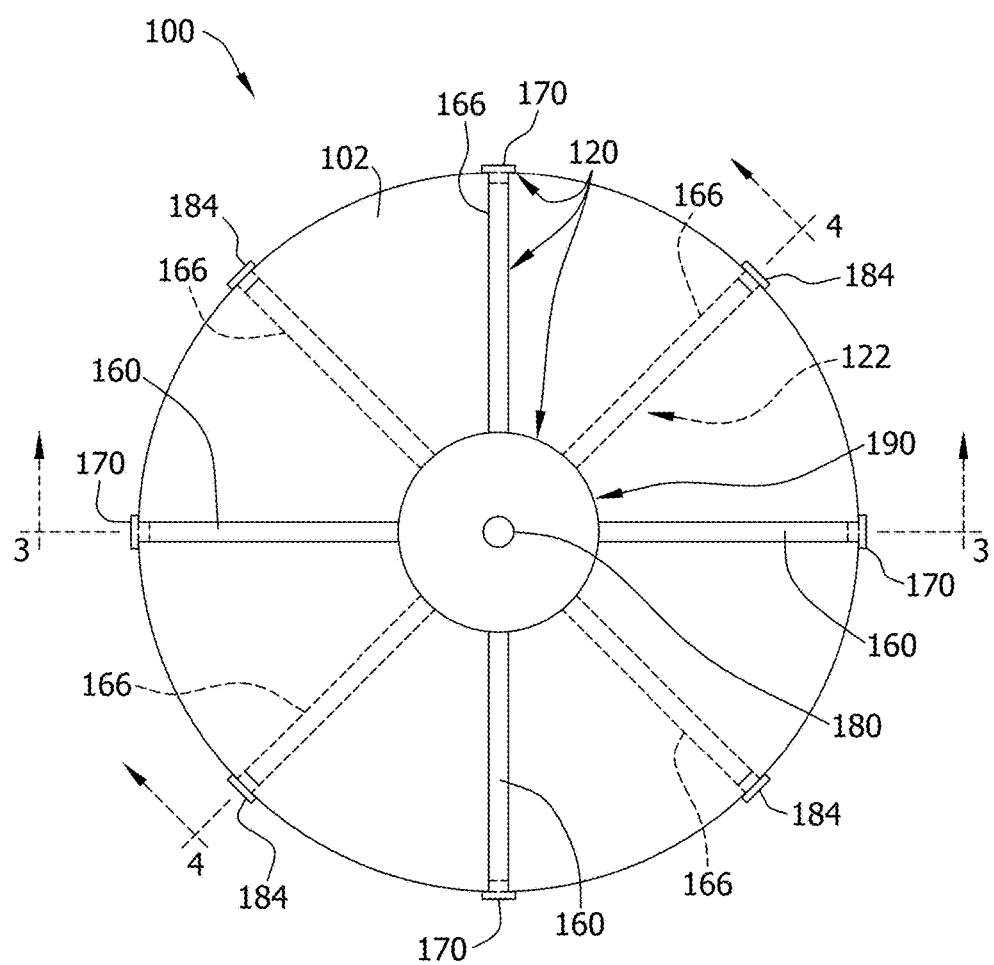
FIG. 1 is a top view of an apparatus for cleaving a bonded wafer structure.
Figure 2:
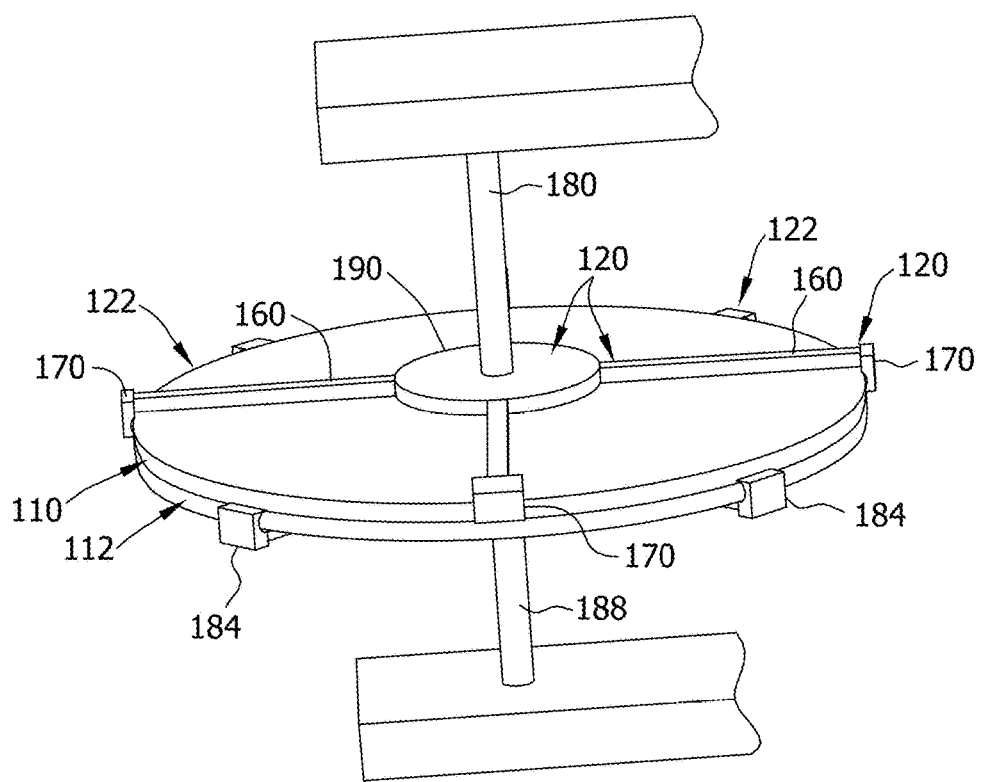
FIG. 2 is a perspective view of the apparatus of FIG. 1.
Figure 8:
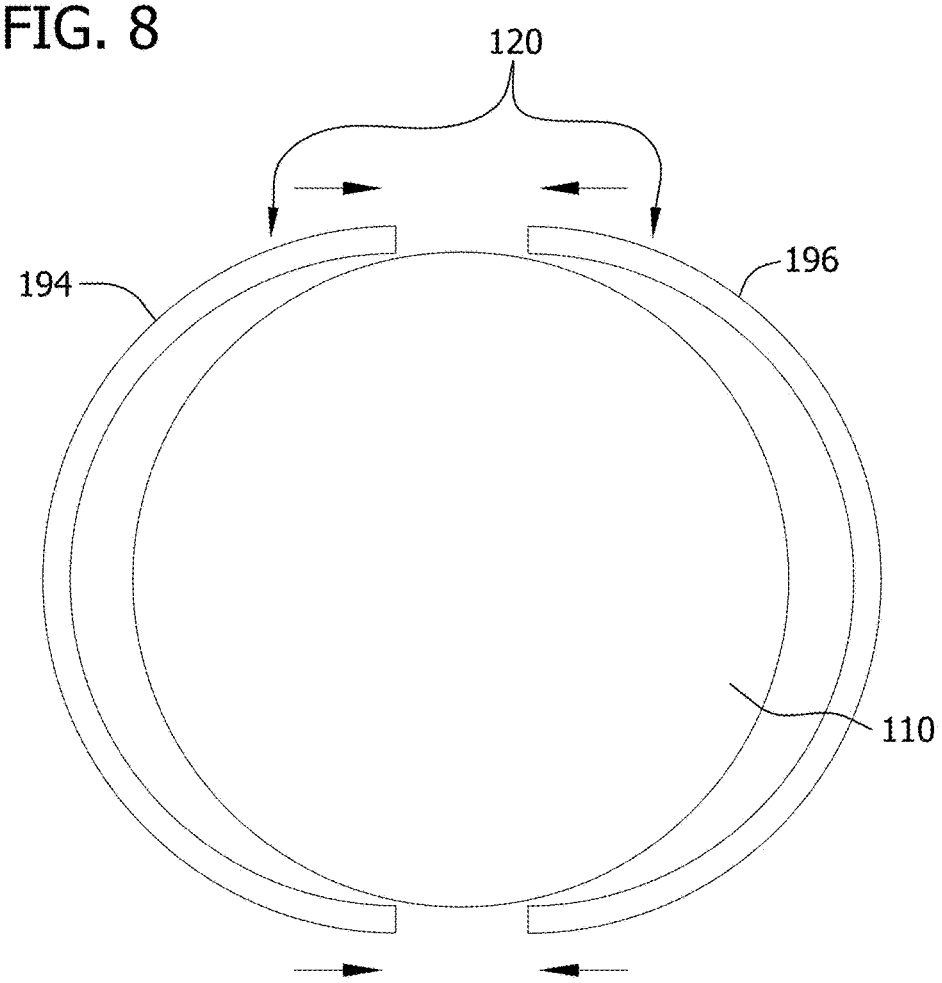
FIG. 8 is a top view of an apparatus used for cleaving a bonded wafer structure before securing the structure.
Figure 9:
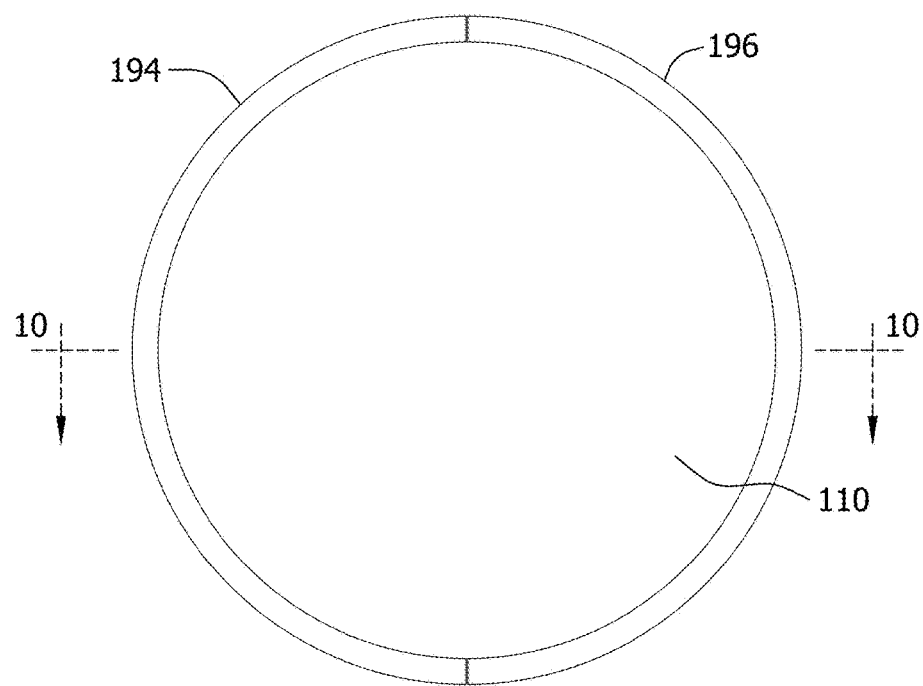
FIG. 9 is a top view of an apparatus used for cleaving a bonded wafer structure after securing the structure.
Figure 10:
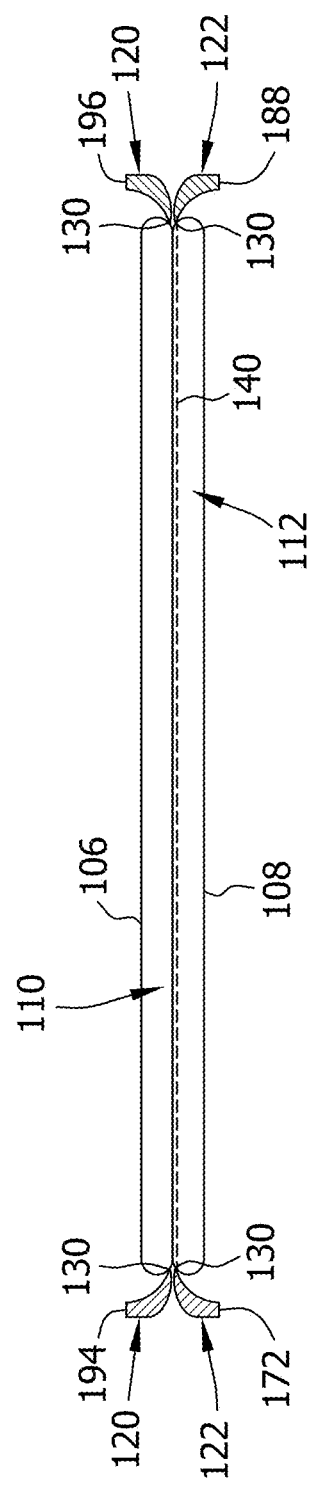
FIG. 10 is a cross-sectional view of Figure taken along line 10-10.

As shown in FIG. 1, the first grasping member 120 has four arms 160 and four clamps 170 and the second grasping member 122 also has four arms 166 and four clamps 184. However, it should be noted that each member 120, 122 of the apparatus 100 may have more or less arms and clamps without limitation. In some embodiments, the apparatus 100 does not have arms but rather annular members for gripping the respective wafers as shown in FIGS. 8-10 and described below.

Each first clamp 170 has a surface 130 (FIGS. 3 and 5) which contacts the upwardly tapered edge 152 of the handle wafer 110. Similarly, each second clamp 184 has a surface 130 (FIGS. 4 and 6) that contacts the downwardly tapered edge 148 of the donor wafer 112. As shown in further detail in FIG. 7, the end portion of the first clamp 170 has a curved profile such that the surface 130 of the arm may enter the depression 144 and contact the upwardly tapered edge 152 of the handle wafer 110 (FIG. 5). In this regard, the term "curved" should not be considered limiting and refers to a profile in which the arm generally changes its angular direction relative to other portions of the arm and may include one or more discreet changes in direction (e.g., the arm may form one or more angles within its length).

It should be noted that while the first clamp 170 is shown with a curvature of 180°, in other embodiments such as embodiments wherein the arm does not extend from the center of the bonded structure, the clamp may have a curvature other than 180°. For example, the arm 160 may be perpendicular to the front and back surfaces of the bonded structure and the clamp 170 may curve about 90° into the depression 144 to contact its surface 130 with the tapered edge 152. In some embodiments, the clamp 170 does not have a curved profile such as embodiments wherein the arm extends from the opposite direction as the arm shown in FIG. 7 (i.e., from outside of the bonded structure). In this regard, the second clamp 184 may have a shape and/or dimensions similar to the first clamp 170. However, the second clamp 184 is oriented opposite that of the first clamp 170 to allow the second clamp 184 to grasp the donor wafer 112 (i.e., the clamp 184 curves upward towards the depression 144 (FIG. 5) rather than downward). The clamps 170, 184 may have other shapes and/or dimensions (e.g., different from each other) without limitation.

Figure 7:
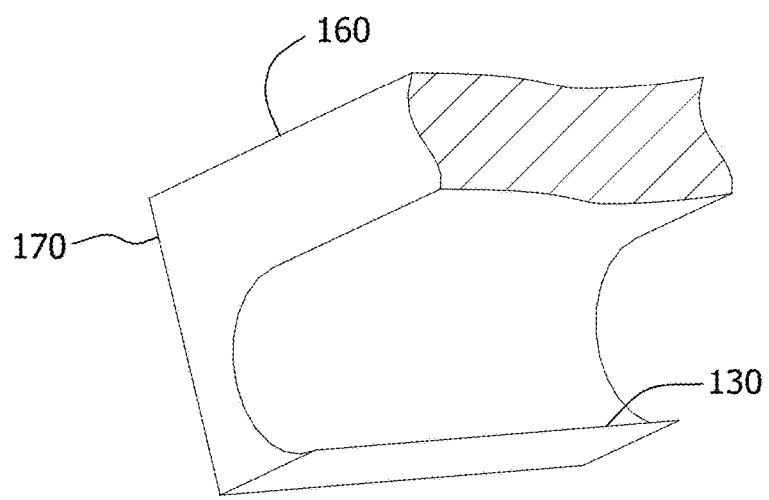
FIG. 7 is a perspective view of a clamp used in an apparatus for cleaving a bonded wafer structure.

As shown in FIG. 7, the first clamp 170 converges to form an edge which is the surface 130 which contacts the handle wafer 110 of the bonded structure 102. However, in other embodiments, the surface 130 may also have a width (i.e., the surface may be rectangular or square rather than an edge) or may be a singular point which contacts the surface. Further, the surface 130 may be arcuate and optionally may have a shape which is complementary to the tapered edge of the handle wafer to increase contact between the handle wafer and the surface 130. The surface 130 of the second clamp 184 may have a shape described above in regard to the surface 130 of the first clamp 170.

To separate the bonded structure 102, the first grasping member 120 and/or the second grasping member 122 grasps that bonded structure. Before being grasped, the bonded structure 102 may be moved into position by robotic means or by use of one of more of the grasping members 120, 122. Before cleaving, the other grasping member grasps the structure. The bonded structure 102 may be grasped by the first grasping member 120 by extending and retracting one or more of the arms 160 of the member 120 by use of a first actuator (not shown) that forms part of or is attached to the first member 120. Similarly, the bonded structure 102 is grasped by the second grasping member 122 by use of a second actuator (not shown) that is attached to or forms part of the second member 122 to extend and retract one or more arms 166 of the second grasping member 122. Actuation of the arms 160, 166 of the first grasping member 120 and second grasping member 122 may be achieved by any method known to those of skill in the art including, for example, pneumatic, hydraulic or mechanical actuation.

After the bonded structure 102 is grasped by the first grasping member 120 and the second grasping member 122, a force is applied to one or both of the first grasping member 120 and second grasping member 122 to separate the bonded structure 102 at the cleave plane 140. In this regard, an actuator (not shown) may be attached to the first grasping member 120. The actuator causes the first grasping member 120 to apply an upward force to the handle wafer 110 to separate the structure. Alternatively or additionally, an actuator (the same one or a different actuator) may be attached to the second grasping member 122 that is operable to cause the second grasping member 122 to apply a downward force on the donor wafer 112. The actuator(s) may be attached to the shafts 180, 182 or may be attached to other portions of the grasping members 120 or 122. It should be noted that only one of the first grasping member 120 and second grasping member 122 needs to be actuated to provide the force used to separate the bonded structure and the other clamp may be maintained in a stationary position. However, in some embodiments both the first grasping member 120 and second grasping member 122 are actuated.

The cleaving process may be initiated by use of a blade (not shown) that exerts force on the bonded structure 102. The blade is inserting into the depression 144 formed between the handle wafer 110 and donor wafer 112 and exerts force along the bonded structure edge. The force results in the initiation of a cleave along the cleave plane 140. This cleave in combination with the force exerted by one or both of the grasping members 120, 122 results in the cleaving and separation of the bonded structure along the cleave plane 140. The blade is movable in a lateral direction by an actuator (not shown) or other suitable mechanism.

In some embodiments of the present disclosure and as shown in FIGS. 8-10, rather than having a plurality of arms, the grasping member may include one or more annular members which at least partially encompass the bonded structure. As shown in FIG. 8, the first grasping member 120 includes a first annular member 194 and a second annular member 196 to grasp the handle wafer 110 of the bonded structure. The second grasping member 122 (FIG. 10) may also have a first annular member 172 and a second annular member 188 for grasping the donor wafer 112.

The first annular member 194 and second annular member 196 of the first grasping member 120 each have a surface 130 (FIG. 10) that contacts the first upwardly tapered edge of the handle wafer 110. Similarly, the first annular member 172 and second annular member 188 has a surface 130 that contacts the downwardly tapered edge of the donor wafer 112. As indicated by arrows in FIG. 8, the annular members 194, 196 are actuated to contact the handle wafer 110 at its edge (FIG. 9). The annular members 172, 188 of the second grasping member 122 may be actuated in a similar manner. Once the handle wafer and donor wafer are grasped, the first grasping member 120 and/or second grasping member 122 may be actuated to apply opposing forces and cause the bonded structure to cleave.

It should be noted that the annular members of the first grasping member 120 and second grasping member 122 need not be arranged such that the handle wafer 110 and donor wafer 112 are contacted continuously at their respective peripheral edges. The annular members may contact discreet portions of the peripheral edge (i.e., the annular members may have a length less than half the circumference of the bonded structure when the grasping member has two annular members). Further, each grasping member may have more than two grasping members without limitation.

Figure 11:
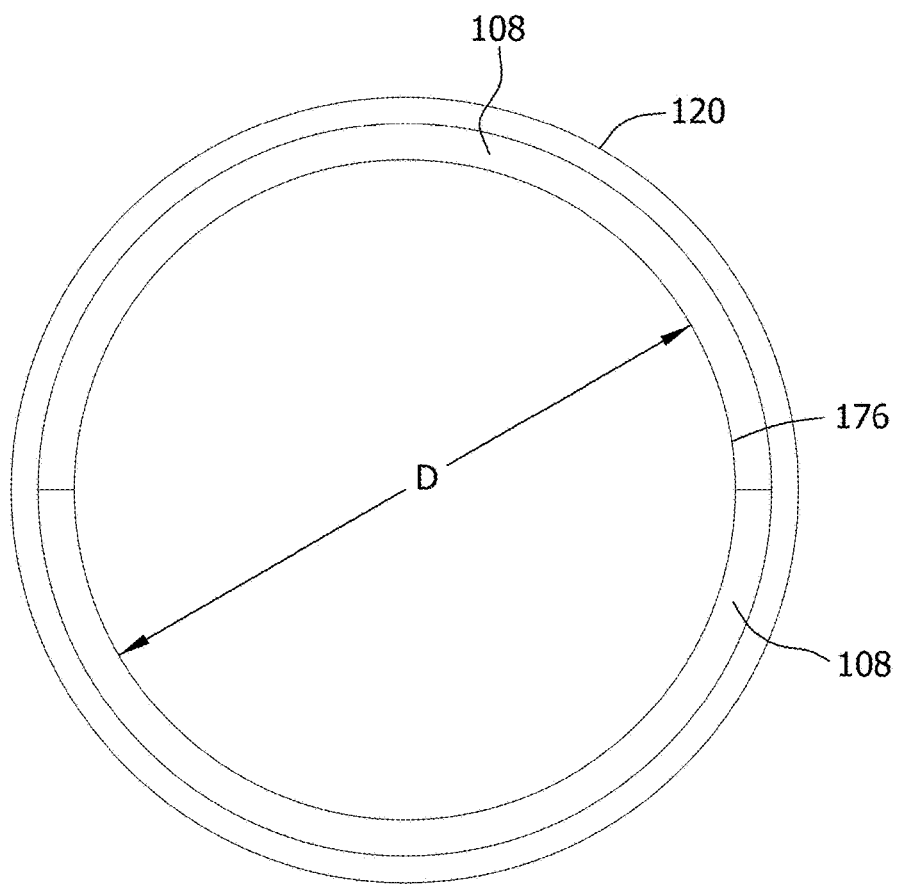
FIG. 11 is a top view of an apparatus for cleaving a bonded wafer.

In some embodiments, one or both of the grasping members are composed of one annular member (i.e., the grasping member is a continuous annulus) that has an actuated edge that allows the grasping member to change diameter to allow the donor and/or handle wafer to be grasped and released after cleaving. An exemplary grasping member 120 is shown in FIG. 11. The grasping member 120 includes an actuated lip 176 which may have one or more actuated portions 108 which change the inner diameter D of the grasping member upon actuation. The grasping member moves axially with respect to the bonded structure to grasp the bonded structure (i.e., approaches the bonded structure from above or below the structure) rather than moving radially as with the grasping members 120, 122 shown in FIGS. 8-10.

Without being held to any particular theory, it is believed that non-uniform thickness and/or roughness variations in the layers of structures (e.g., SOI structures) produced according to previous systems were caused by localized stress applied to the surface of the bonded structure. The embodiments described herein reduce or eliminate this problem by applying force at the wafer edge thereby reducing or eliminating thickness and/or roughness variations in the resulting device layer.

EXAMPLES

The processes of the present disclosure are further illustrated by the following Examples. These Examples should not be viewed in a limiting sense.

Example 1: Comparison of the ACCUMAP® Image of a SOI Structure Cleaved by Use of Suction Cups and a SOI Structure Cleaved by Applying Opposing Forces at the Wafer Edge A bonded wafer pair was cleaved by a conventional process that used suction cups to separate the donor wafer from the resulting SOI structure. The cleave was initiated by used of cleave blade. A second SOI structure was also prepared by applying an upward and downward force to the bonded structure after the cleave was initiated by the cleave blade.

Figure 12:
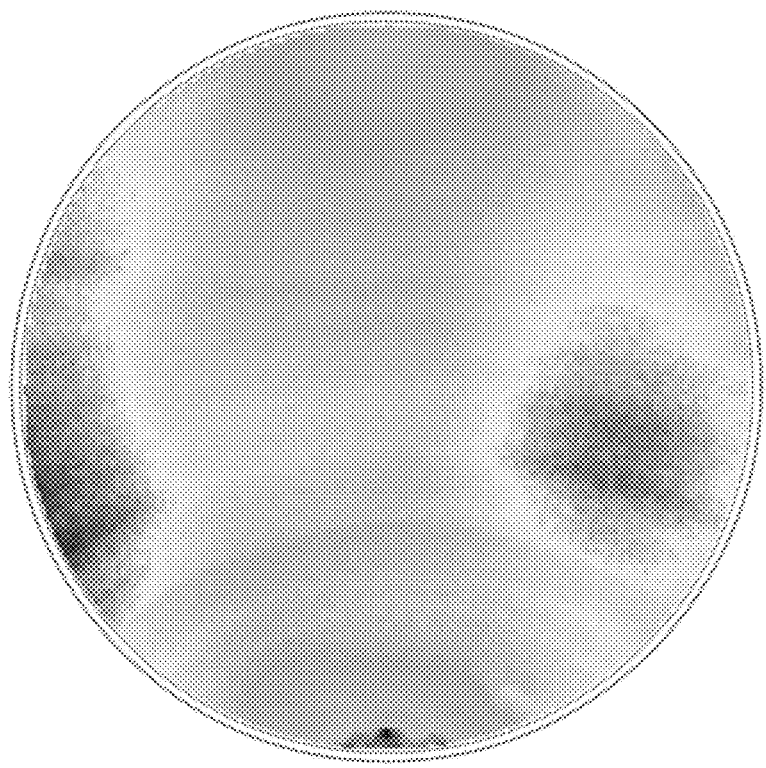
FIG. 12 is black and white ACCUMAP® image of a surface of a SOI wafer after cleaving by a conventional process using suction cups.
Figure 13:
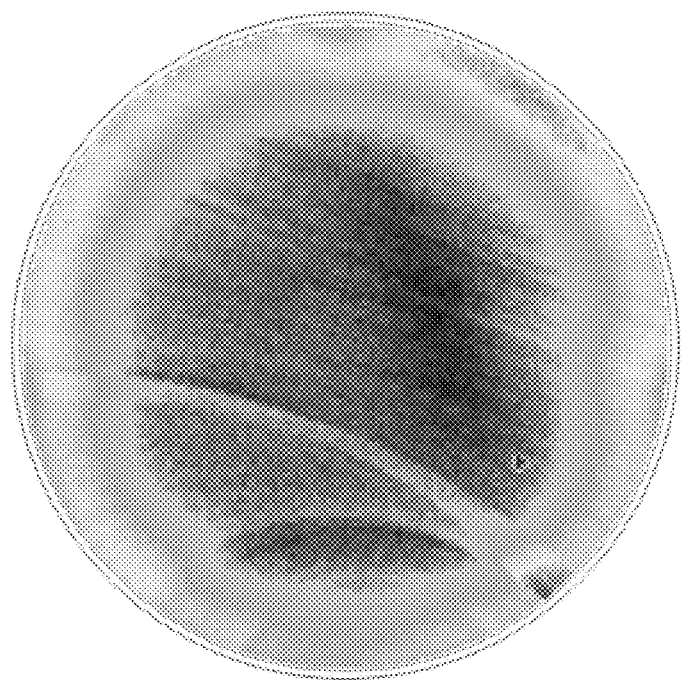
FIG. 13 is black and white ACUMAP® image of a surface of a SOI wafer after cleaving by a process in which opposite forces are applied at the bonded wafer edge.

After the wafer was cleaved to produce the SOI structures, the surface of the device layer was imaged to produce an ACCUMAP® image (ACCUMAP® 3220; ADE). The image produced from the SOI structure cleaved by the conventional method that used suction cups is shown in FIG. 12 and the image produced from the SOI structure cleaved by applying opposite forces at the bonded wafer edge is shown in FIG. 13. As can be seen from FIG. 12, the SOI structure produced by using suction cups during the cleave had strong cleave striations at the bottom, far left and far right of the image. The SOI structure of FIG. 13 is more symmetrical and results in greater thickness uniformity.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. An apparatus for cleaving a bonded wafer structure having a first wafer and a second wafer, the first wafer having a peripheral edge including a first portion, the second wafer having a peripheral edge including a second portion, the first portion disposed opposite the second portion, the apparatus comprising:
   a first arm that extends radially toward the peripheral edge of the first wafer,
   a first clamp mounted on the first arm, the first clamp having a surface for contacting the first portion of the peripheral edge of the first wafer;
   a second arm that extends radially toward the peripheral edge of the second wafer, and
   a second clamp mounted on the second arm, the second clamp having a surface for contacting the second portion of the peripheral edge of the second wafer.

2. The apparatus as set forth in claim 1 further comprising:
   a plurality of arms having a clamp mounted thereto for contacting a portion of the peripheral edge of the first wafer; and
   a plurality of arms having a clamp mounted thereto for contacting a portion of the peripheral edge of the second wafer.

3. The apparatus as set forth in claim 2 further comprising:
   a first actuator for radially extending and retracting at least the first clamp to secure and release the first wafer; and
   a second actuator for radially extending and retracting at least the second clamp to secure and release the second wafer.

4. The apparatus as set forth in claim 1 further comprising an actuator attached to the first clamp, the first clamp applying force to the first wafer to cleave the bonded wafer structure upon activation of the actuator.

5. The apparatus as set forth in claim 1 further comprising an actuator attached to the second clamp, the second clamp applying a force to the second wafer to cleave the bonded wafer structure upon activation of the actuator.

6. The apparatus as set forth in claim 1 wherein the first clamp includes an edge, the edge including the surface for contacting the first portion of the peripheral edge of the first wafer.

7. The apparatus as set forth in claim 1 wherein the second clamp includes an edge, the edge including the surface for contacting the second portion of the peripheral edge of the second wafer.

8. The apparatus as set forth in claim 1 further comprising a first shaft attached to the first arm and a second shaft attached to the second arm, the first shaft being perpendicular to the first arm and the second shaft being perpendicular to the second arm.

9. A system comprising the apparatus as set forth in claim 1 in combination with the bonded wafer structure, the first clamp, bonded structure and second clamp being stacked vertically.

10. A method of cleaving a bonded wafer structure comprising a first wafer and a second wafer, the first wafer having a peripheral edge including a first portion, the second wafer having a peripheral edge including a second portion, the first portion disposed opposite the second portion, the method comprising:
    contacting the first portion of the peripheral edge of the first wafer with a surface of a first clamp mounted on a first arm that extends radially toward the peripheral edge of the first wafer;
    contacting the second portion of the peripheral edge of the second wafer with a surface of a second clamp mounted on a second arm that extends radially toward the peripheral edge of the first wafer; and
    cleaving the bonded wafer structure by at least one of (1) applying a force on the first wafer by actuating the first clamp away from the second clamp or (2) applying a force on the second wafer by actuating the second clamp away from the first clamp.

11. The method as set forth in claim 10 further comprising inserting a blade between the first wafer and the second wafer to initiate cleaving of the bonded wafer pair.

12. The method as set forth in claim 10 wherein surfaces of a plurality of clamps similar to the first clamp mounted to arms similar to the first arm contact the first portion of the peripheral edge of the first wafer.

13. The method as set forth in claim 10 wherein surfaces of a plurality of clamps similar to the second clamp mounted to arms similar to the second arm contact the second portion of the peripheral edge of the second wafer.

14. The method as set forth in claim 10 comprising:
    actuating at least the first clamp to extend and retract at least the first clamp to secure the first wafer;
    actuating at least the second clamp to extend and retract at least the second clamp to secure the second wafer;
    actuating at least the first clamp to extend and retract at least the first clamp to release at least a portion of the first wafer; and
    actuating at least the second clamp to extend and retract at least the second clamp to release at least a portion of the second wafer.

15. The method as set forth in claim 10 comprising actuating the first clamp to apply an upward force to the first wafer to cleave the bonded wafer structure.

16. The method as set forth in claim 10 comprising actuating the second clamp to apply a downward force to the second wafer to cleave the bonded wafer structure.

17. The method as set forth in claim 10 wherein the first clamp includes an edge having a shape complementary to the first portion of the peripheral edge of the first wafer, the edge including the surface for contacting the first portion of the peripheral edge of the first wafer.

18. The method as set forth in claim 10 wherein the second clamp includes an edge having a shape complementary to the second portion of the peripheral edge of the second wafer, the edge including the surface for contacting the second portion of the peripheral edge of the second wafer.

19. The method as set forth in claim 10 wherein the first clamp, bonded structure and second clamp are stacked vertically.

* * * * *